(12) United States Patent
Shaw et al.

(10) Patent No.: US 12,273,478 B2
(45) Date of Patent: *Apr. 8, 2025

(54) SPINNING ACCESSORY FOR MOBILE DEVICE

(71) Applicants: Scott Phillip Shaw, Isle of Palms, SC (US); Omer Salik, Hermosa Beach, CA (US)

(72) Inventors: Scott Phillip Shaw, Isle of Palms, SC (US); Omer Salik, Hermosa Beach, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 17/589,557

(22) Filed: Jan. 31, 2022

(65) Prior Publication Data

US 2022/0159114 A1    May 19, 2022

Related U.S. Application Data

(63) Continuation of application No. 17/023,794, filed on Sep. 17, 2020, now Pat. No. 11,290,584, which is a continuation of application No. 16/735,221, filed on Jan. 6, 2020, now Pat. No. 10,855,826.

(60) Provisional application No. 62/790,986, filed on Jan. 10, 2019.

(51) Int. Cl.
| | | |
|---|---|---|
| *H04M 1/04* | (2006.01) | |
| *F16M 11/10* | (2006.01) | |
| *F16M 11/20* | (2006.01) | |
| *F16M 11/38* | (2006.01) | |
| *F16M 13/00* | (2006.01) | |
| *G06F 1/16* | (2006.01) | |
| *H04M 1/02* | (2006.01) | |
| *H05K 5/02* | (2006.01) | |

(52) U.S. Cl.
CPC .............. *H04M 1/04* (2013.01); *F16M 11/10* (2013.01); *F16M 11/2078* (2013.01); *F16M 11/38* (2013.01); *F16M 13/005* (2013.01); *H04M 1/026* (2013.01); *H05K 5/0204* (2013.01); *G06F 1/1626* (2013.01); *H05K 5/023* (2013.01); *H05K 5/0234* (2013.01)

(58) Field of Classification Search
CPC . H04B 1/3833; H04B 1/3888; H04M 1/0202; H04M 1/0283; H04M 1/185; B29D 24/001; A45C 11/00; A45C 13/36; G06F 1/1633

See application file for complete search history.

(56) References Cited

U.S. PATENT DOCUMENTS

| | | | | |
|---|---|---|---|---|
| 6,034,492 A | * | 3/2000 | Saito ..................... | H02J 7/1415 |
| | | | | 290/1 R |
| 6,288,519 B1 | * | 9/2001 | Peele ....................... | H02J 7/32 |
| | | | | 320/107 |

(Continued)

*Primary Examiner* — Nguyen T Vo

(57) ABSTRACT

A mobile device accessory comprising a base that affixes to a mobile device, and a rotating element, such as a rotary ball-bearing disc, coupled to said base allowing for the device to spin along the axis of the rotating element. The accessory may further comprise hinged or extendable arms. The accessory may further comprise a power source or motor for rotating the accessory. The accessory may further comprise a control circuit coupled to a software application capable of controlling the rotation of the spinning element.

3 Claims, 4 Drawing Sheets

(56) References Cited

U.S. PATENT DOCUMENTS

| | | | | |
|---|---|---|---|---|
| 8,844,098 | B2* | 9/2014 | Karmatz | B25G 1/102 |
| | | | | 16/422 |
| 10,892,625 | B1* | 1/2021 | Franklin | A45C 15/00 |
| 2010/0277126 | A1* | 11/2010 | Naeimi | H02K 7/1853 |
| | | | | 320/137 |
| 2013/0303000 | A1* | 11/2013 | Witter | F16B 5/0642 |
| | | | | 403/324 |
| 2016/0040825 | A1* | 2/2016 | Franklin | F16M 13/02 |
| | | | | 439/39 |
| 2018/0288204 | A1* | 10/2018 | Nahum | A45F 5/10 |
| 2018/0316843 | A1* | 11/2018 | Guyot | H04N 23/63 |
| 2018/0359346 | A1* | 12/2018 | Chen | F16M 13/00 |
| 2019/0168683 | A1* | 6/2019 | Wang | F16M 13/022 |
| 2019/0245960 | A1* | 8/2019 | Nahum | H04M 1/04 |
| 2020/0328605 | A1* | 10/2020 | Weber | H02J 50/10 |
| 2021/0111615 | A1* | 4/2021 | Mitri | H02K 53/00 |
| 2021/0111617 | A1* | 4/2021 | Mitri | H02K 49/108 |
| 2021/0111618 | A1* | 4/2021 | Mitri | H02K 1/02 |
| 2022/0057211 | A1* | 2/2022 | Nakashima | B81B 7/0074 |

\* cited by examiner

SPINNING ACCESSORY FOR MOBILE DEVICE

The present application is a continuation of and claims priority to the earlier filed U.S. non-provisional utility application Ser. No. 17/023,794 filed on Sep. 17, 2020, which is a continuation of application Ser. No. 16/735,221 filed on Jan. 6, 2020, which claims priority to U.S. provisional application having Ser. No. 62/790,986 filed on Jan. 10, 2019 and hereby incorporates the subject matter of the provisional application and parent applications in their entirety.

FIELD OF THE INVENTION

The present invention relates to cases, attachments and similar accessories for mobile devices and portable media players. In particular, embodiments of the one or more present inventions relate to a mobile device case, attachment or accessory that includes a spinning component for spinning the mobile device.

BACKGROUND OF THE INVENTION

Mobile devices, including portable media players, are often affixed with attachments or housed in protective covers or cases in order to help grip the device or protect the device from breaking, scratching or other damage. Such cases increase the effective size of the media player and often provide no function other than gripping or limited protection of the device.

Some device cases include an extra feature to enable further functionality beyond protection. For instance, some cases have extendable components for standing the mobile device on one of its sides. Other cases have grips or finger holes to improve gripping of the mobile device. One shortcoming of each of these cases is that they are designed primarily to maintain the mobile device in a stationary state and do not provide the user with a new mechanic for engaging with the mobile device, such as spinning the device. Rather, each of these cases only improve functionality of existing physical interactions with the device, such as gripping or standing the device. It is also known in the prior art to provide toys that people can spin about a point, such as a top or a fidget spinner.

A need remains in the art for mobile device cases and accessories that perform a multitude of functions, as noted above, without adding significantly to the effective size of the device and that provides users with a new mechanism for engaging with the device, such as the ability to spin the mobile device. Moreover, a need remains to provide a software application that functions with the new mechanism for engaging with the mobile device.

BRIEF SUMMARY OF THE INVENTION

One or more embodiments of the one or more present inventions are directed to a mobile device case, attachment or accessory that includes a spinning component such that the mobile device itself can be spun around an axis of the device case. The spinning of the device may be performed manually or through a power source and motor coupled to the device case, attachment or accessory. Additional embodiments include additional case functionality, such as an extending component for cord management, to provide a stand or to aid in gripping the device.

Still further embodiments include one or more software applications that work together with the spinning function of the case or accessory. For example, a software application may be provided that provides different interactive games based on the spinning of the device using the accelerometer and compass functions of the device. Other software applications may provide for a light show or other visual effects based on the spinning of the device. Other software applications may provide for spinning of the device in response to other software applications, such as music being played.

While aspects of the invention may be described herein with reference to various embodiments, it should be appreciated that any such examples are for illustrative purposes only and are not intended to be limiting.

DETAILED DESCRIPTION

The embodiments described herein relate to one or more inventions relating to a mobile device case, attachment or accessory that includes a spinning component. One or more embodiments of the one or more present inventions are directed to a mobile device case, attachment or accessory that, in addition to a spinning component, provides extending arms for serving other purposes, such as one or more of managing cords, forming standing legs, gripping or clipping. One or more embodiments of the one or more present inventions are directed to providing a software application that is responsive to the spinning motion of the mobile device provided by the case.

The accessory or case may include an adhesive plate for coupling to the back of the mobile device and at least one rotary ball bearing component or other spinning mechanism in the center of the plate. In other embodiments, the accessory or case may fit around the perimeter of the mobile device. In preferred embodiments, the attachment structure and its components are relatively thin so as to not add substantial depth to the mobile device.

Figure 1:
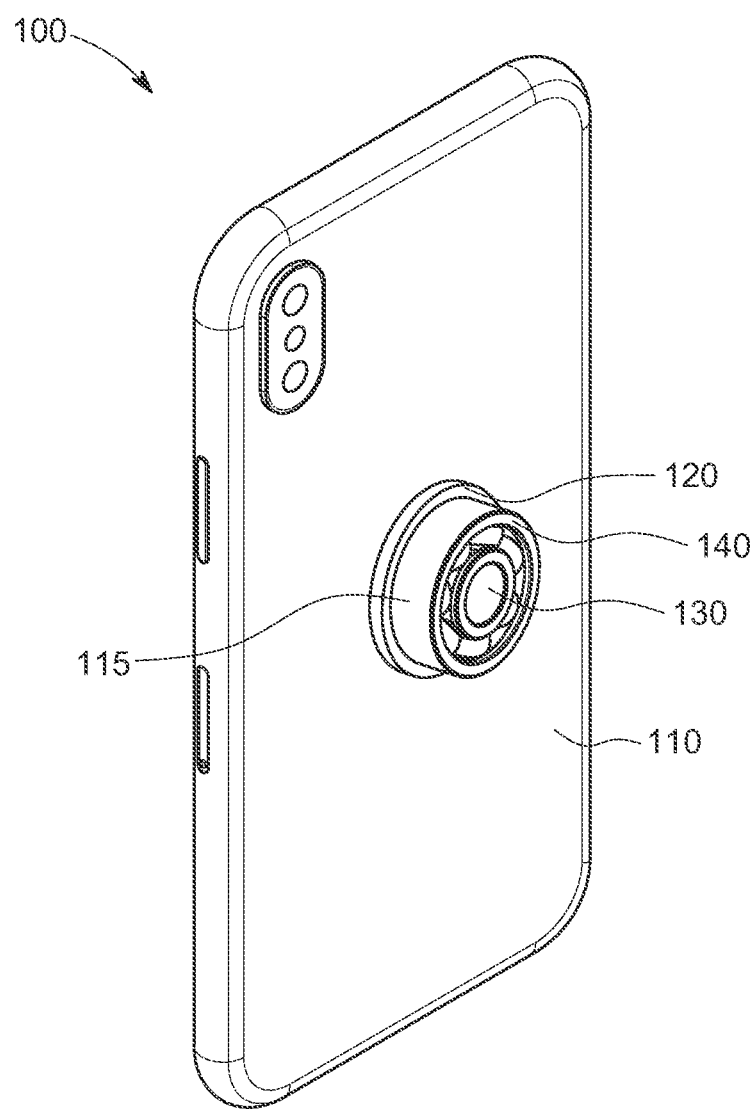
FIG. 1 shows an embodiment of a mobile device attachment consistent with one or more of the present inventions.

Referring to FIG. 1, which depicts an embodiment of a mobile device having an attachment consistent with one or more of the present inventions 100. The mobile device 110 typically has a generally rectangular shape, though the attachment disclosed herein may be used on any shaped device. The embodiment shown in FIG. 1 includes a circular ball bearing device 115 that is affixed to the back of the mobile device 110 via an adhesive disc 120. The ball bearing device 115 is generally comprised of a rotating assembly 130, 140 having multiple rings containing balls in between. The ball bearing device 115 may be made of metal, ceramic, plastic or other known materials suitable for rotation assemblies. In other embodiments, hub and spoke assemblies, axle assemblies or other known rotational assemblies may be used instead of a ball bearing device.

In certain embodiments, the adhesive disc 120 is coupled to the exterior circumference of the ball bearing device 140. In other embodiments, the adhesive disc may be coupled to the circumference of the interior ring 130 ball bearing device 140. In other embodiments, the adhesive disc 120 may incorporated into an inner axle situated in the center 130 of the ball bearing device 115. The adhesive disc 120 may be made of plastic, metal or other material and includes an adhesive backing so that it may be attached to the surface of the mobile device 110. The surface of the adhesive disc 120 is comprised of an adhesive material of sufficient strength to affix the ball bearing assembly 115 to the back of the mobile device 110 to allow the mobile device 110 to rotate on the center axis of the ball bearing device 115.

In other embodiments, the attachment 100 may use other known methods for being physically affixed to the mobile device 110 other than adhesives. For example, the attachment 100 may be physically affixed to the mobile device 110 through a magnet. In other embodiments, the attachment 100 may be physically affixed to the mobile device 110 by having a base that extends to and affixes to at least a portion of the outer edge of the mobile device 110.

The mobile device with the disclosed attachment 100 allows the mobile device 110 to be spun around the axis of the rotary ball bearing 140, thus providing the user with a new way to engage with his or her device. Either the interior 130 or exterior 140 components of the ball bearing device 115 may be used for rotation of the mobile device 110 on a surface, such as a desk. In certain embodiments, the inner or outer rings of the ball bearing device may be implemented with a surface having higher friction for better contact with a table or other surface on which the mobile device will spin. In other embodiments, the ball bearing device 140 may be incorporated into a mobile device case.

Figure 2:
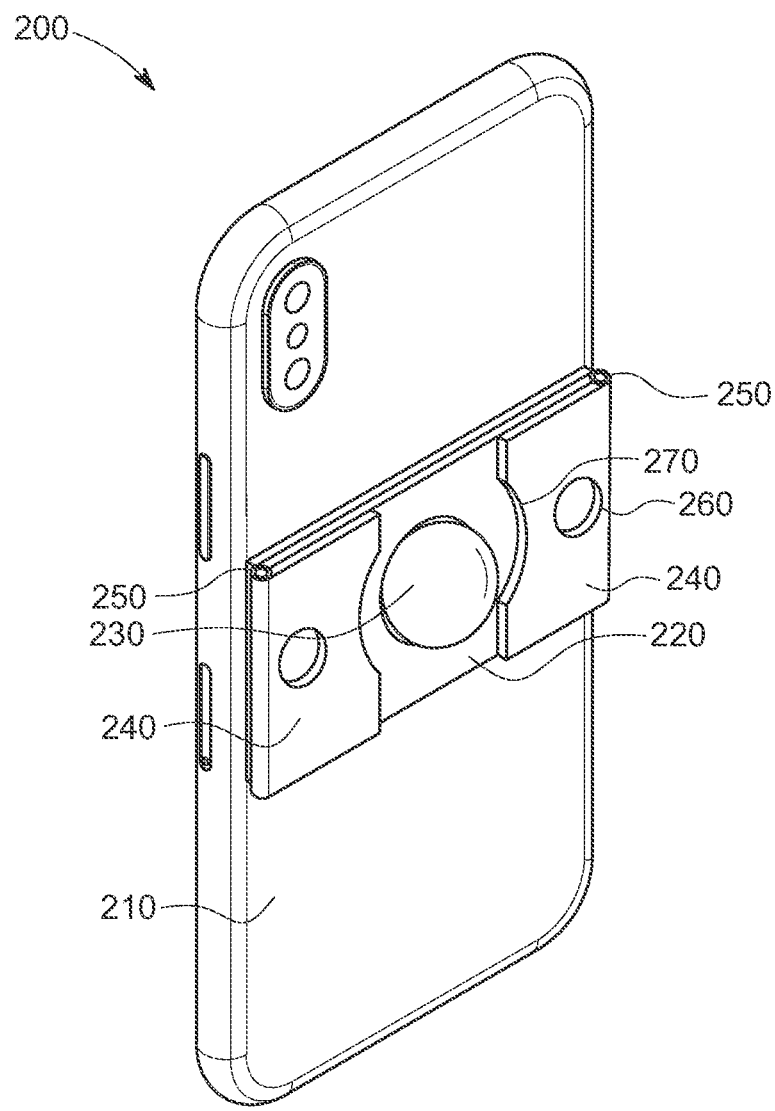
FIG. 2 shows an embodiment of a mobile device attachment consistent with one or more of the present inventions.

Referring to FIG. 2, which depicts another embodiment of a mobile device with an attachment consistent with one or more aspects of the present inventions 200. The embodiment of the attachment shown in FIG. 2 includes a base plate 220 having an adhesive side that may be affixed to the mobile device 210. The base plate 220 has a rotary ball bearing 230. At either end of the base plate 220 are pivoting arms 240 that are affixed to the plate 220 by a hinging mechanism 250. The arms 240 may be folded in to lie flat. The arms 240 may also be rotated outward from the surface of the mobile device 210. Depending on the orientation of the arms 240, the arms may serve as a stand for the mobile device 210 or as grips for the mobile device. In preferred embodiments, the each of the arms 240 includes a hole 260 to allow a user to insert a figure that may help facilitate gripping. In other preferred embodiments, each of the arms 240 includes a curved notch 270 to allow the arms 240 to fold down onto the surface of the mobile device 210 without interfering with the rotary ball bearing 230.

Figure 3:
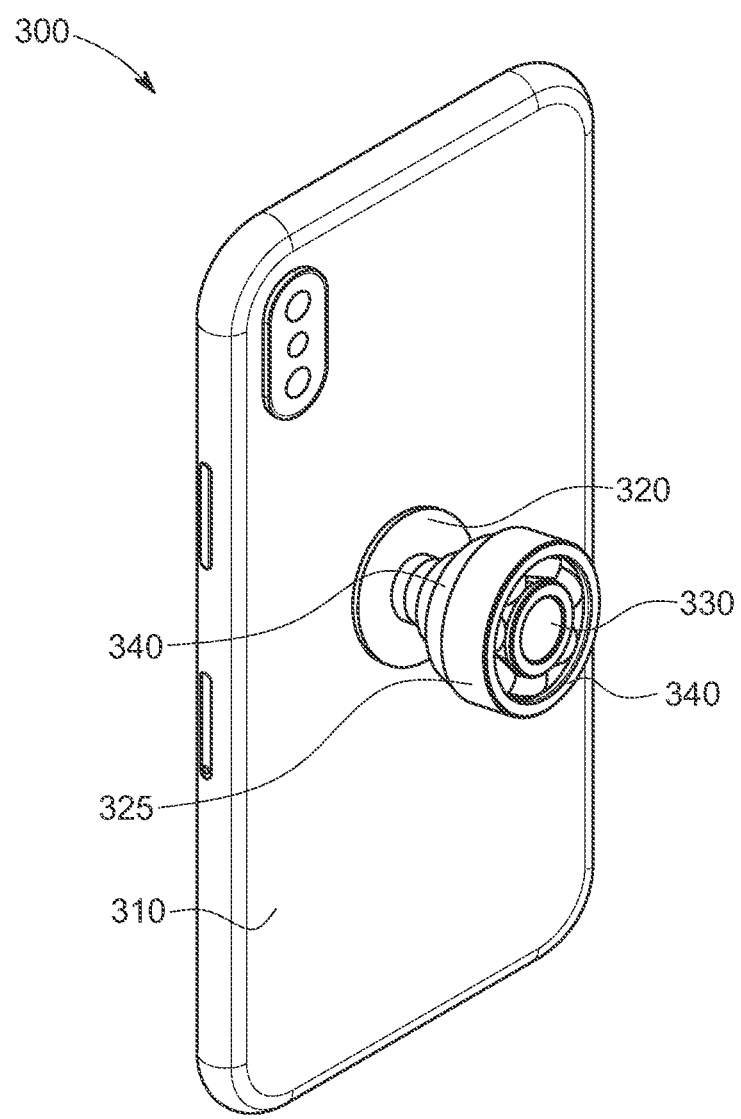
FIG. 3 shows an embodiment of a mobile device attachment consistent with one or more of the present inventions.

Referring to FIG. 3, which depicts another embodiment of a mobile device with an attachment consistent with one or more of the present inventions 300. The embodiment of the case shown in FIG. 3 includes an adhesive plate 320 and rotary ball bearing plate 325. The attachment may be affixed to the mobile device 310 through the adhesive surface of the plate 320. In between the rotary ball bearing 330 and the adhesive pad 320 is an extending element 340. The extending element 340 may be pushed down towards the surface of the mobile device 310 or extended out away from the surface of mobile device 310. The extending element 340 may be comprised of multiple concentric tubes or rings to allow for extension and retraction through a telescoping mechanism. The extending arm 340 may also be implemented through other mechanism, such as an accordion mechanism, screw-rotating (helical) mechanism, multiple alternating hinged plates, or collapsible scissor-arm mechanism.

At the end of the extending element 340 is a ball bearing device 325 having an inner 330 and outer 340 rotating components with ball bearing in between. The mobile device 310 may be spun using the rotary ball bearing 325 whether the extending element 330 is extended or retracted. In some preferred embodiments, either the outer component 340 or inner component of the ball bearing device 325 may comprise a high-friction to allow for better contact with a surface, such as a desk, to allow for improved spinning of the mobile device 310. When extended, the extending element 334 may be used as a stand or a grip for the mobile device 310.

Figure 4:
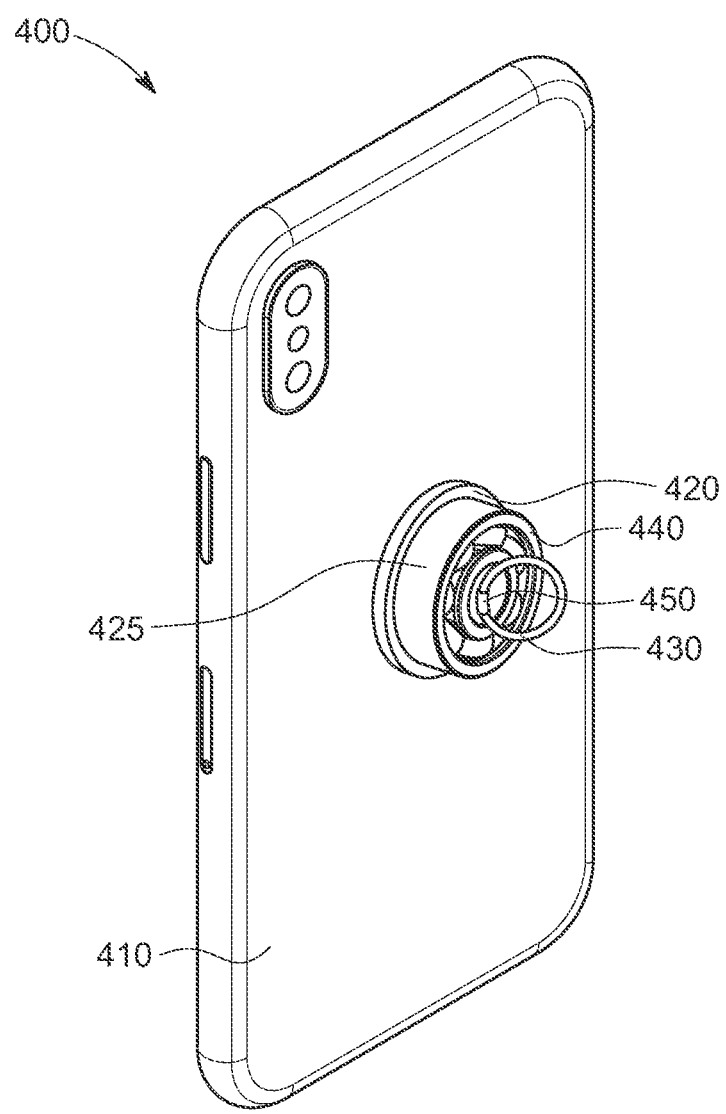
FIG. 4 shows an embodiment of a mobile device attachment consistent with one or more of the present inventions.

Referring to FIG. 4, which depicts another embodiment of a mobile device with an attachment consistent with one or more of the present inventions 400. The embodiment of the attachment shown in FIG. 4 includes an adhesive plate 420 and rotary ball bearing 425 similar to that shown in FIG. 1. The attachment may be affixed to the mobile device 410 through the adhesive surface of the plate 420. Coupled to the inner portion of the ball bearing device 425 is an inner ring 430 that can hinge 450 away from the ball-bearing disc. When extended out, the inner ring 430 can serve as a stand for the mobile device or as a grip. When pushed down, the ring 430 optimally lays flat on the inner disc of the ball bearing device. In alternative embodiments, the ring 430 fits within the recess between the two ball bearing discs along the inner circumference of the outer ball bearing ring 440.

For each of the one or more embodiments disclosed herein for the one or more inventions disclosed herein, the mobile device attachment or case may include a power source, such as a battery, a power cord for connecting to the mobile device or other power source, or an induction circuit for receiving power from the mobile device or other inductive source. The power source may be coupled to a rotating motor to power the rotation of the ball bearing device of the accessory to spin without manual power. The power source and rotating mechanism may be housed in the adhesive plate or in the ball bearing device itself. The power source may be a battery, such as a 3V battery commonly used in watches, or other type of replaceable or rechargeable battery. In other embodiments, the power source may be the phone battery itself, wherein the rotating mechanism is powered through inductive coupling to the phone's battery utilizing the NFC capabilities of modern smartphones.

For each of the one or more embodiments disclosed herein the one of or more inventions disclosed herein, one or more software applications may be downloaded to the mobile device for use in connection with the device case or accessory. The software application may be used to control the spinning of the accessory either through software commands that are communicated to and control the rotation of the motor coupled to the ball bearing device. In other embodiments, the software may control the rotation of the ball bearing device by controlling the inductive power delivered from the device to the accessory's power source and motor.

For example, a software application may provide for sounds, lights or other effects to be emitted from the mobile device in response to the spinning of the device using the case or accessory. Many mobile devices include an accelerometer and compass for detection of orientation that may be used in connection with the software application to detect the speed and direction of the mobile device spinning. Other software applications may spin the device in response to music, using the power source and motor. For example, a software application could provide for a dynamic light show emitted from the mobile device that is coordinating with music playing from the device or elsewhere, where the phone emits lights and spins to create visual effects.

What is claimed is:

1. An mobile device accessory for spinning a mobile device having a battery and a non-transitory computer-readable storage medium with computer-executable instructions, comprising:

an accessory less than an inch in thickness attached to said mobile device, said accessory comprising a securing element for attaching the accessory to the exterior of the mobile device, a rotating element connected to the securing element, said rotating element comprising a first ring and a second ring, wherein said first ring and said second ring have different diameters and are positioned concentrically, wherein said second ring provides a rotating wheel and said first ring provides a fixed axle, in which said first ring is stationary and said second ring rotates and wherein said first ring and said second ring are separated by at least four balls interposed in the space between said first and second ring, said balls reducing the friction between said first ring and said second ring;

said accessory having a motor coupled to said rotating element to spin said rotating element, wherein said motor is conductively coupled to said mobile device battery, wherein said mobile device battery provides power for said motor to spin said rotating element;

wherein said spin of said rotating element is controlled by said power provided to said motor;

wherein said power provided to said motor is controlled by computer-executable instructions stored in said mobile device.

2. The accessory of claim 1 wherein said controlling of said spin of said rotating element of said accessory is responsive to an audio file being played on said mobile device.

3. The accessory of claim 1 wherein said controlling of said rotating element is responsive to a audiovisual file being played on said mobile device.

* * * * *